US011903260B2

(12) United States Patent
Bing

(10) Patent No.: US 11,903,260 B2
(45) Date of Patent: Feb. 13, 2024

(54) OLED DISPLAY PANEL WITH SAME COLOR SUB-PIXEL GROUPS

(71) Applicant: Shenzhen China Star Optoelectronics Semiconductor Display Technology Co., Ltd., Shenzhen (CN)

(72) Inventor: Yifei Bing, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/969,565

(22) PCT Filed: Jun. 3, 2020

(86) PCT No.: PCT/CN2020/094197
§ 371 (c)(1),
(2) Date: Aug. 13, 2020

(87) PCT Pub. No.: WO2021/227153
PCT Pub. Date: Nov. 18, 2021

(65) Prior Publication Data
US 2023/0131455 A1 Apr. 27, 2023

(30) Foreign Application Priority Data
May 14, 2020 (CN) .......................... 202010407396.7

(51) Int. Cl.
*H10K 59/122* (2023.01)
*H10K 59/35* (2023.01)
(52) U.S. Cl.
CPC ......... *H10K 59/122* (2023.02); *H10K 59/352* (2023.02)

(58) Field of Classification Search
CPC .................................................. H10K 59/122
See application file for complete search history.

(56) References Cited

U.S. PATENT DOCUMENTS

| 2009/0121983 A1* | 5/2009 | Sung | H10K 59/352 |
| | | | 345/76 |
| 2014/0197396 A1* | 7/2014 | Madigan | H10K 71/135 |
| | | | 438/34 |
| 2018/0053811 A1 | 2/2018 | Wacyk | |

FOREIGN PATENT DOCUMENTS

| CN | 101587681 A | 11/2009 |
| CN | 104022143 A | 9/2014 |

(Continued)

OTHER PUBLICATIONS

International Search Report in International application No. PCT/CN2020/094197, dated Feb. 18, 2021.

(Continued)

*Primary Examiner* — Peter Bradford
(74) *Attorney, Agent, or Firm* — Menachem Nathan; Nathan & Associates

(57) ABSTRACT

The present disclosure provides a display panel, including a first pixel group, a second pixel group, and a third pixel group with different colors. The first pixel group and the second pixel group are sequentially arranged along a first direction, and both include four sub-pixels arranged in a matrix. The third pixel group is adjacent to the first pixel group and the second pixel group, and the third pixel group includes at least two third sub-pixels sequentially arranged along the first direction. A demand of products for printing accuracy requirement of a printing equipment can be reduced under a premise that a number of high pixels per inch (PPI) remains unchanged.

14 Claims, 5 Drawing Sheets

(56) References Cited

FOREIGN PATENT DOCUMENTS

| CN | 106711173 A | | 5/2017 | |
|---|---|---|---|---|
| CN | 207320118 U | | 5/2018 | |
| CN | 108492723 A | | 9/2018 | |
| CN | 109326623 A | | 2/2019 | |
| CN | 109509779 A | | 3/2019 | |
| CN | 110634909 A | | 12/2019 | |
| CN | 110634934 A | | 12/2019 | |
| CN | 209911711 U | | 1/2020 | |
| CN | 111180482 A | * | 5/2020 | ........... H01L 27/156 |
| CN | 114335097 A | * | 4/2022 | |

OTHER PUBLICATIONS

Written Opinion of the International Search Authority in International application No. PCT/CN2020/094197, dated Feb. 18, 2021.
Chinese Office Action issued in corresponding Chinese Patent Application No. 202010407396.7 dated Nov. 24, 2022, pp. 1-7.
Chinese Office Action issued in corresponding Chinese Patent Application No. 202010407396.7 dated Jul. 1, 2023, pp. 1-6.

* cited by examiner

OLED DISPLAY PANEL WITH SAME COLOR SUB-PIXEL GROUPS

CROSS REFERENCE TO RELATED APPLICATIONS

This application claims priority of the Chinese patent application numbered 202010407396.7, filed on May 14, 2020 with the National Intellectual Property Administration and titled "DISPLAY PANEL", which is incorporated by reference in the present application in its entirety.

FIELD OF INVENTION

The present disclosure relates to the field of display technologies, and particularly relates to a display panel.

BACKGROUND OF INVENTION

Organic light-emitting diodes (OLEDs) have an anode, organic functional layers, and a cathode formed on a substrate in sequence. The organic functional layers generally include a hole injection layer (HIL), a hole transport layer (HTL), an emitting functional layer (EML), an electron transport layer (ETL), and an electron injection layer (EIL). At present, each of the organic functional layers and a cathode metal layer film are prepared by a vacuum thermal evaporation process, that is, organic small molecule materials are heated in a vacuum chamber to sublimate or melt and vaporize into vapor materials, and the vapor materials are deposited on a glass substrate through openings of a metal mask. However, due to high costs of vacuum thermal evaporation, large-scale commercialization of OLED displays is limited.

Inkjet printing has advantages of high material utilization and so on, and it is a key technology to reduce costs of large-size OLED displays. A method of the inkjet printing is to drop functional material ink into a predetermined pixel area by multiple nozzles, and then obtain a desired film by drying. Grooves are usually made in predetermined pixel areas of a substrate used in a printing film formation process to limit the ink. And after drying and baking, the ink shrinks within the limit of pixel grooves to form a specific light-emitting pixel. However, due to limitations of a solution process and accuracy of printing equipment, if sizes of the grooves are too small, mixing of solutions in different grooves may occur. Pixels with a mixing phenomenon may exhibit obvious differences in brightness and chromaticity during display, which may have a strong impact on product quality and seriously limit application prospects of the inkjet printing for manufacturing the OLED with high pixels per inch (PPI).

Therefore, it is necessary to make improvements to the pixel structure in the prior art.

Technical Problems

An embodiment of the present disclosure provides a display panel to solve a technical problem that in a display panel of the prior art, when pixels are manufactured by inkjet printing, due to limitations of a solution process and accuracy of printing equipment, if sizes of grooves are too small, mixing of solutions in adjacent grooves may occur, which in turn causes differences in brightness and chromaticity during display and affects product quality.

Technical Solutions

To solve the above problem, technical solutions provided by the present disclosure are as followings:

An embodiment of the present disclosure provides a display panel including a plurality of pixel repeating units distributed in an array, each of the pixel repeating units includes a first pixel group, a second pixel group and a third pixel group with different colors, wherein the first pixel group and the second pixel group are sequentially arranged along a first direction, the third pixel group is adjacent to the first pixel group and the second pixel group, the first pixel group includes four first sub-pixels arranged in a matrix, the second pixel group includes four second sub-pixels arranged in another matrix, the third pixel group includes at least two third sub-pixels sequentially arranged along the first direction, each of the third sub-pixels is adjacent to one of the first sub-pixels and one of the second sub-pixels, virtual lines between a center of each of the third sub-pixels, a center of an adjacent first sub-pixel, and a center of an adjacent second sub-pixel define a triangle, an area of each of the first sub-pixels is equal to an area of each of the second sub-pixels, an area of each of the third sub-pixels is twice the area of each of the first sub-pixels, and the display panel comprises a first pixel definition layer, wherein the first pixel group, the second pixel group, and the third pixel group are separated from each other by the first pixel definition layer.

In at least one embodiment of the present disclosure, the display panel further includes a second pixel definition layer, four of the first sub-pixels of the first pixel group and four of the second sub-pixels of the second pixel group are separated from each other by the second pixel definition layer.

In at least one embodiment of the present disclosure, a height of the first pixel definition layer is greater than a height of the second pixel definition layer.

In at least one embodiment of the present disclosure, the first pixel definition layer further separates two adjacent of the third sub-pixels from each other.

In at least one embodiment of the present disclosure, the first pixel group is defined as a first pixel printing unit, the second pixel group is defined as a second pixel printing unit, and each of the third sub-pixels is defined as a third pixel printing unit.

In at least one embodiment of the present disclosure, the third pixel group includes four third sub-pixels arranged in a matrix along the first direction and a second direction.

In at least one embodiment of the present disclosure, adjacent of the third sub-pixels arranged along the second direction are separated from each other by the second pixel definition layer.

In at least one embodiment of the present disclosure, the first pixel group is defined as a first pixel printing unit, the second pixel group is defined as a second pixel printing unit, and two adjacent of the third sub-pixels arranged along the second direction are defined as a third pixel printing unit.

An embodiment of the present disclosure further provides another display panel including a plurality of pixel repeating units distributed in an array, each of the pixel repeating units includes a first pixel group, a second pixel group and a third pixel group with different colors, wherein the first pixel group and the second pixel group are sequentially arranged along a first direction, the third pixel group is adjacent to the first pixel group and the second pixel group, the first pixel group includes four first sub-pixels arranged in a matrix, the second pixel group includes four second sub-pixels arranged in another matrix, the third pixel group includes at least two third sub-pixels sequentially arranged along the first direction, and each of the third sub-pixels is adjacent to one of the first sub-pixels and one of the second sub-pixels, virtual lines between a center of each of the third sub-pixels, a center of an adjacent first sub-pixel, and a center of an adjacent second sub-pixel define a triangle.

In at least one embodiment of the present disclosure, an area of each of the first sub-pixels is equal to an area of each of the second sub-pixels, an area of each of the third sub-pixels is twice the area of each of the first sub-pixels.

In at least one embodiment of the present disclosure, the display panel includes a first pixel definition layer, wherein the first pixel group, the second pixel group, and the third pixel group are separated from each other by the first pixel definition layer.

In at least one embodiment of the present disclosure, the display panel further includes a second pixel definition layer, four of the first sub-pixels of the first pixel group and four of the second sub-pixels of the second pixel group are separated from each other by the second pixel definition layer.

In at least one embodiment of the present disclosure, a height of the first pixel definition layer is greater than a height of the second pixel definition layer.

In at least one embodiment of the present disclosure, the height of the first pixel definition layer ranges from 1 micron to 2 microns, and the height of the second pixel definition layer ranges from 0.5 microns to 1 micron.

In at least one embodiment of the present disclosure, the first pixel definition layer further separates two adjacent of the third sub-pixels.

In at least one embodiment of the present disclosure, the first pixel group is defined as a first pixel printing unit, the second pixel group is defined as a second pixel printing unit, and each of the third sub-pixels is defined as a third pixel printing unit.

In at least one embodiment of the present disclosure, the third pixel group includes four third sub-pixels arranged in a matrix along the first direction and a second direction.

In at least one embodiment of the present disclosure, adjacent of the third sub-pixels arranged along the second direction are separated from each other by the second pixel definition layer.

In at least one embodiment of the present disclosure, the first pixel group is defined as a first pixel printing unit, the second pixel group is defined as a second pixel printing unit, and two adjacent of the third sub-pixels arranged along the second direction are defined as a third pixel printing unit.

In at least one embodiment of the present disclosure, a light-emitting pixel unit is composed of one of the first sub-pixels, one of the second sub-pixels, and one of the third sub-pixels.

BENEFICIAL EFFECTS

The present disclosure integrates four sub-pixels of a same color into a pixel printing unit for printing, thereby reducing a demand of products for printing accuracy requirement of a printing equipment under a premise that a number of high pixels per inch (PPI) remains unchanged, and effectively increasing the number of the PPI of the products while under a condition of a same printing accuracy.

DETAILED DESCRIPTION OF EMBODIMENTS

The present disclosure provides a display panel. In order to make the purpose, technical solutions, and effects of the present disclosure clearer, the present disclosure will be further described in detail below with reference to the accompanying drawings and embodiments. It should be understood that the specific embodiments described herein are merely used to explain the present disclosure, and are not used to limit the present disclosure.

Figure 1:
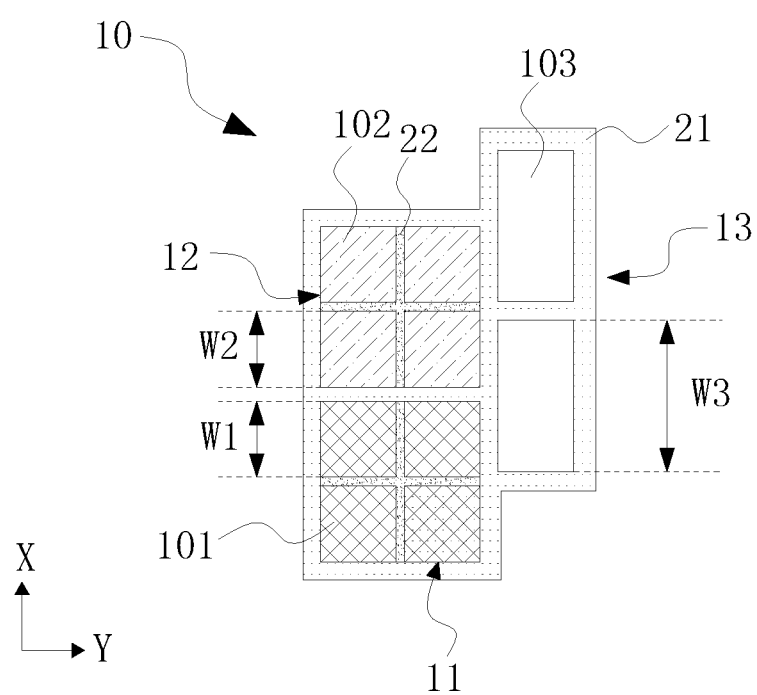
FIG. 1 is a schematic view of a pixel repeating unit provided by an embodiment of the present disclosure.
Figure 2:
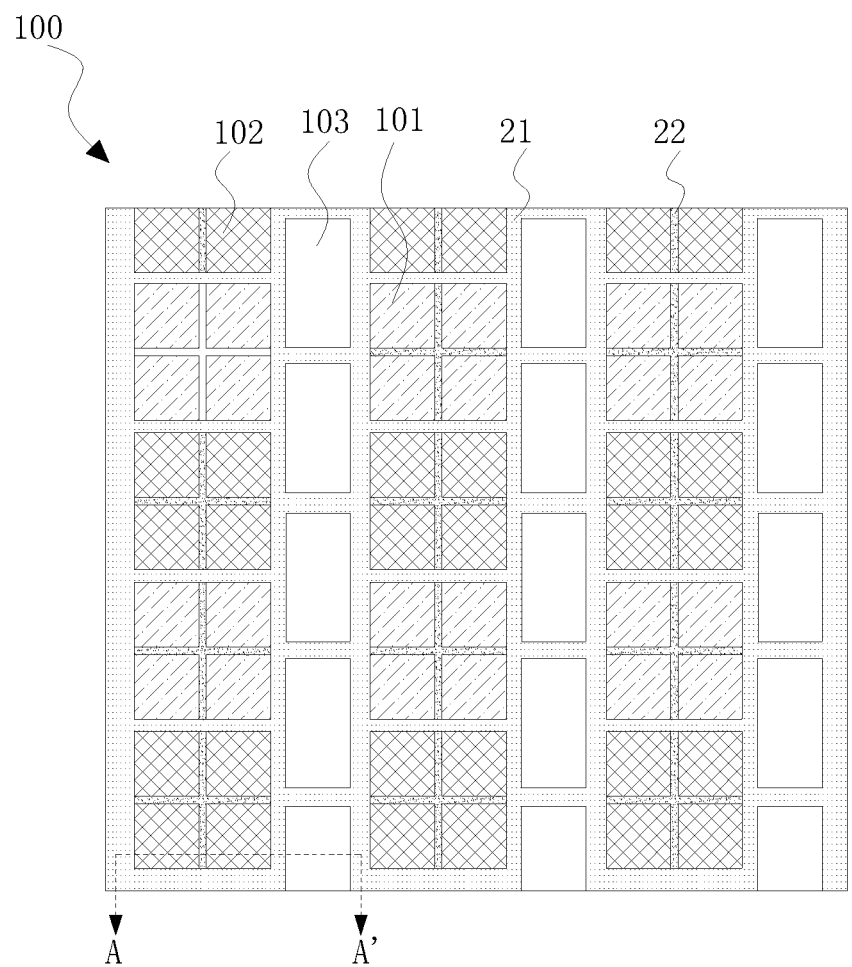
FIG. 2 is a schematic view of a pixel arrangement provided by an embodiment of the present disclosure.

As shown in FIG. 1 and FIG. 2, an embodiment of the present disclosure provides a display panel 100 including a plurality of pixel repeating units 10 distributed in an array. Each of the pixel repeating units 10 includes a first pixel group 11, a second pixel group 12, and a third pixel group 13 with different colors.

The first pixel group 11 and the second pixel group 12 are sequentially arranged along a first direction X, and the third pixel group 13 is adjacent to the first pixel group 11 and the second pixel group 12.

The first pixel group 11 includes four first sub-pixels 101 arranged in a matrix (2×2), and the second pixel group 12 includes four second sub-pixels 102 arranged in another matrix (2×2).

The third pixel group 13 at least includes two third sub-pixels 103 sequentially arranged along the first direction X. In the embodiment, the third pixel group includes a column of two third sub-pixels 103 sequentially arranged along the first direction X. In other embodiments, the third pixel group includes two columns of the two third sub-pixels 103.

In a pixel arrangement structure, each of the third sub-pixels 103 is adjacent to one of the first sub-pixels 101 and one of the second sub-pixels 102, and virtual lines between a center of each of the third sub-pixels 103, a center of an adjacent first sub-pixel 101, and a center of an adjacent second sub-pixel 102 define a triangle.

Under a premise that a number of high pixels per inch (PPI) of pixels remains unchanged, a demand of products for printing accuracy requirement of a printing equipment may be reduced by setting the pixel repeating unit 10 with the above arrangement.

There are many ways to set the first direction and a second direction, and the first direction X and the second direction Y may be intersected at any preset angle. Preferably, an angle between the first direction X and the second direction Y is 90 degrees, as X-axis (the first direction) and Y-axis (the second direction) as shown in FIG. 1. Therefore, each of the first sub-pixel 101, each of the second sub-pixel 102, and each of the third sub-pixel 103 can be arranged along horizontal and vertical directions, thereby simplifying a structure and an being easy to manufacture.

The third pixel group 13 and the first pixel group 11 are offset, so that each of the third sub-pixels 103 is adjacent to one of the first sub-pixels 101 and one of the second sub-pixels 102.

Specifically, a width W3 of the third sub-pixel 103 along the first direction X is equal to a sum of a width W1 of the first sub-pixel 101 along the first direction X and a width W2 of the second sub-pixel 102 along the first direction X.

In an embodiment, an area of each of the first sub-pixels 101 is equal to an area of each of the second sub-pixels 102, and an area of each of the third sub-pixels 103 is twice the area of each of the first sub-pixels 101. Two sides of each of the third sub-pixels 103 are directly opposite to two of the first sub-pixels 101 and two of the second sub-pixels 102 respectively, that is, each of the third sub-pixels 103 is defined as a common sub-pixel used in two pixel units, thereby further increasing a number of the PPI while maintaining a same specification of the display panel.

The first sub-pixels 101, the second sub-pixels 102 and the third sub-pixels 103 are one of red sub-pixels, green sub-pixels, and blue sub-pixels, respectively. For example, a lifetime and luminous intensity of a light-emitting material of the blue sub-pixels are weaker, and an area of each of the blue sub-pixels can be designed to be larger. In the embodiment, the third sub-pixels 103 may be the blue sub-pixels, the second sub-pixels 102 may be the green sub-pixels, and the first sub-pixels 101 may be the red sub-pixels.

The first pixel group 11 is defined as a first pixel printing unit (red pixel printing unit), the second pixel group 12 is defined as a second pixel printing unit (green pixel printing unit), and each of the third sub-pixels 103 is defined as a third pixel printing unit (blue pixel printing unit), so that the sub-pixels having a same color can be printed by a same pixel printing unit, thereby solving the problem that the solution in different grooves will be mixed as the grooves of pixels are too small, preventing obvious differences in brightness and chromaticity during display, and improving the display quality of products.

Figure 3:
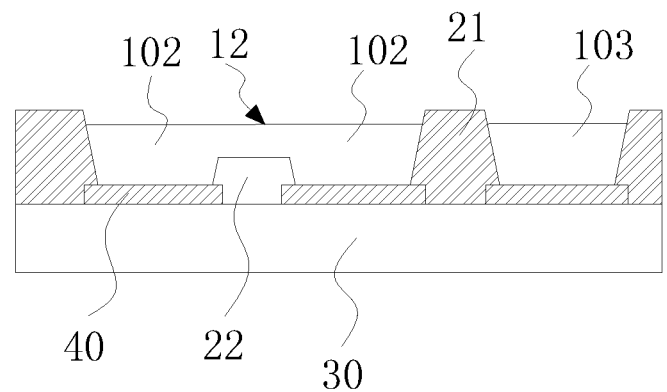
FIG. 3 is a sectional and schematic view along a line of AA' in FIG. 2.

As shown in FIG. 3, the display panel further includes a first pixel definition layer 21. The first pixel group 11, the second pixel group 12, and the third pixel group 13 are separated from each other by the first pixel definition layer 21.

The first pixel definition layer 21 is used to limit the printing ink in each of pixel printing units.

Because each of the third sub-pixels 103 is defined as one pixel printing unit, the first pixel definition layer 21 should also be disposed between two adjacent of the third sub-pixels 103 to separate two adjacent of the third sub-pixels 103, thereby preventing the ink of printing units with different colors from overflowing.

The display panel further includes a second pixel definition layer 22, four of the first sub-pixels 101 of the first pixel group 11 and four of the second sub-pixels 102 of the second pixel group 12 are separated from each other by the second pixel definition layer 22.

Specifically, the second pixel definition layer 22 is used to divide an anode layer 40 corresponding to each of the sub-pixels in the first pixel group 11 or the second pixel group 12, so that each of the sub-pixels corresponds to an independent anode, thereby making each of the sub-pixels driven and lighted independently.

The first pixel definition layer 21 and the second pixel definition layer 22 are disposed on an array substrate 30, the array substrate 30 has the anode layer 40, and the array substrate 30 may include a plurality of thin film transistors arranged in an array.

A height of the first pixel definition layer 21 is greater than a height of the second pixel definition layer 22. Because the second pixel definition layer 22 is used to divide the anode layer of the sub-pixels of each pixel group, and is not used to divide the printing ink of the sub-pixels of each pixel group, the height of the second pixel definition layer 22 does not need to be set too high.

The height of the first pixel definition layer 21 may range from 1 micron to 2 microns, and the height of the second pixel definition layer may range from 0.5 microns to 1 micron.

A light-emitting pixel unit is composed of one of the first sub-pixels 101, one of the second sub-pixels 102, and one of the third sub-pixels 103.

In the embodiment, along the second direction Y, two adjacent light-emitting pixel units share a same one of the third sub-pixels 103, thereby improving a utilization rate of the sub-pixels.

Compared with a common pixel arrangement of R/G/B side by side (SBS), under the same panel specification (resolution) of 55" 4K, a number of the PPI of a pixel structure with SBS is 80, and a number of the PPI of a pixel structure (4 in 1) of the embodiment of the present disclosure can reach 165, the PPI can be increased by 2 times.

Figure 4:
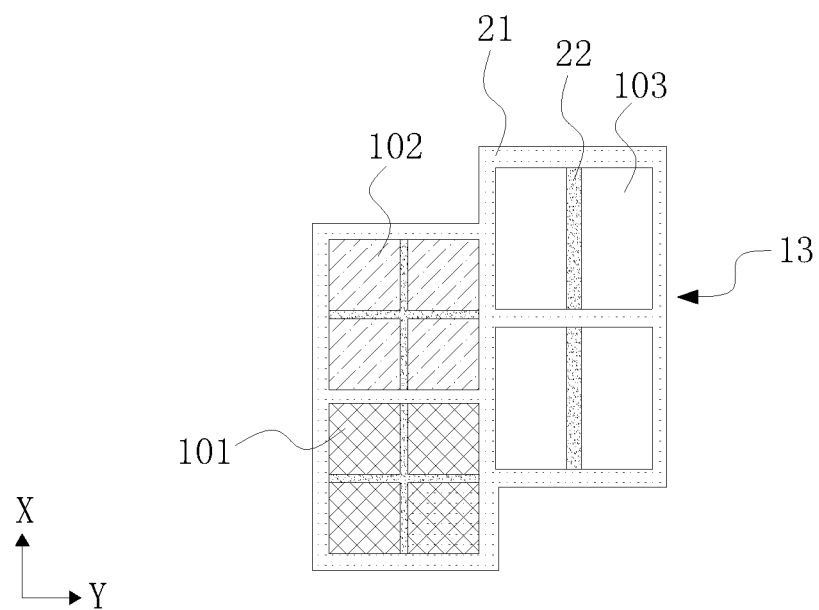
FIG. 4 is a schematic view of a pixel repeating unit provided by other embodiments of the present disclosure.
Figure 5:
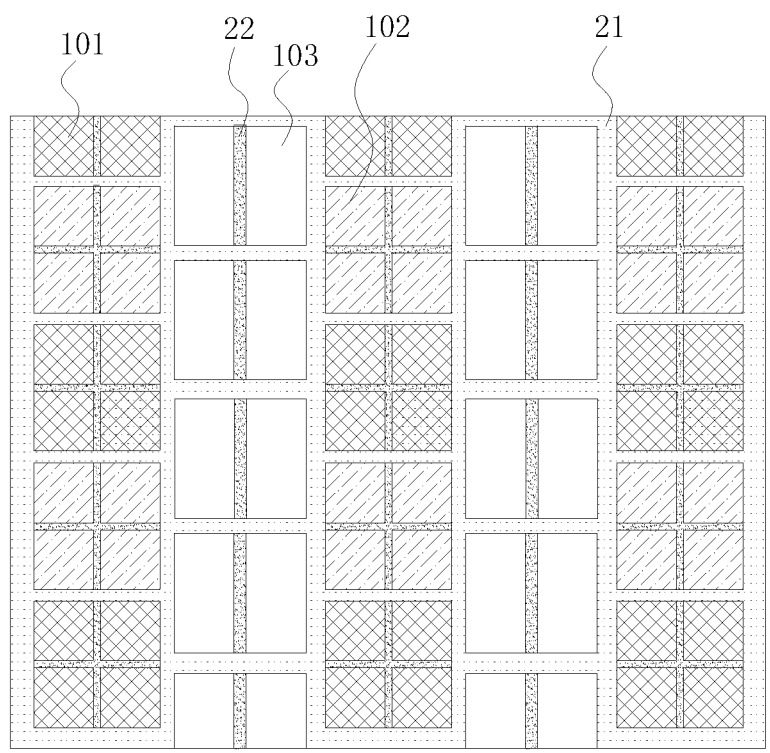
FIG. 5 is a schematic view of a pixel arrangement provided by other embodiments of the present disclosure.

As shown in FIG. 4 and FIG. 5, in other embodiments, along the second direction Y, two adjacent light-emitting pixel units may independently use one of the third sub-pixel 103.

Specifically, the third pixel group 13 includes four of the third sub-pixels 103 in a matrix (2×2) along the first direction X and the second direction Y, that is, compared to the embodiment, the third pixel group 10 may have two columns of the third sub-pixels 103.

Two adjacent of the third sub-pixels 103 arranged along the first direction X may be defined as a pixel printing unit (third pixel printing unit), thereby effectively reducing the demand of the third pixel printing unit for printing accuracy requirement under the premise of keeping the number of the PPI unchanged.

Correspondingly, the second pixel definition layer 22 should also be disposed between two adjacent of the third sub-pixels 103 arranged along the first direction X in a same third pixel group 13, so that the anode layer 40 in two adjacent of the third sub-pixels 103 can be separated from each other.

Compared with the pixel structure of RGB SBS, for the display panel with a same PPI number, the above design can effectively reduce the printing accuracy requirement of a printing equipment. When the resolution of the display panel is 55" 4K, the printing accuracy of the pixel structure with SBS is required to range from minus 34 microns to plus 34 microns, and the printing accuracy of the pixel structure of the present disclosure is required to range from minus 63 microns to plus 63 microns. When the resolution of the display panel is 55" 8K, the printing accuracy of the pixel structure with SBS is required to range from minus 8 microns to plus 8 microns, and the printing accuracy of the pixel structure of the present disclosure is required to range from minus 28 microns to plus 28 microns.

A shape of each of the first sub-pixels 101 and a shape of each of the second sub-pixels 102 may be square, and a shape of each of the third sub-pixels 103 may be rectangular.

Figure 6:
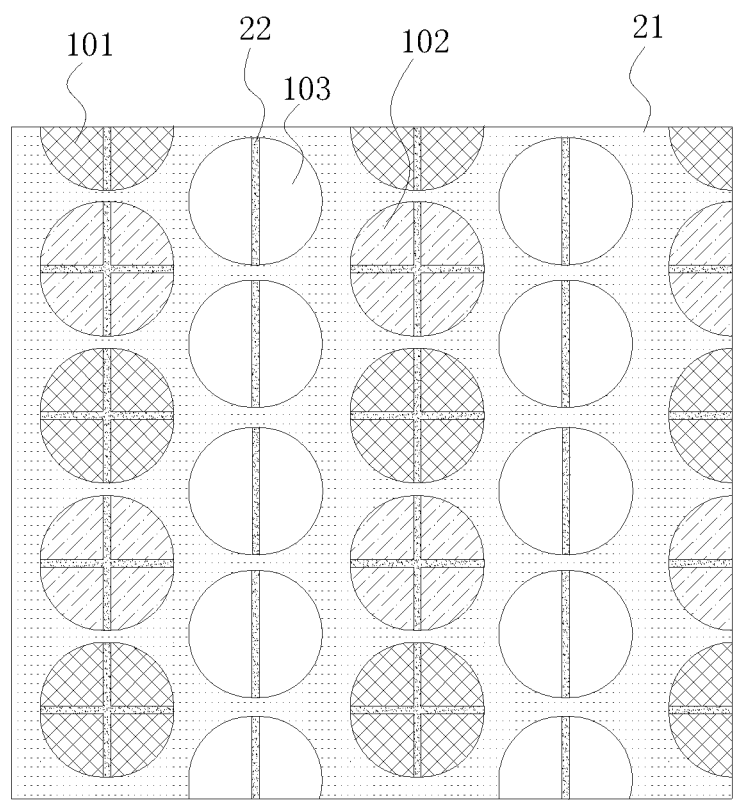
FIG. 6 is another schematic view of a pixel arrangement provided by other embodiments of the present disclosure.

In other embodiments, as shown in FIG. 6, the shape of each of the first sub-pixels 101 and the shape of each of the second sub-pixels 102 may be a quarter circle, and the shape of each of the third sub-pixels 103 may be a semicircular.

In other embodiments, the shape of each of the first sub-pixels 101 and the shape of each of the second sub-pixels 102 may be triangular, and the shape of each of the third sub-pixels 103 may be rectangular.

The present disclosure integrates four sub-pixels of the same color into a pixel printing unit for printing, thereby reducing the demand of products for printing accuracy requirement of a printing equipment under a premise that the number of high pixels per inch (PPI) remains unchanged, and effectively increasing the number of the PPI of the products while under a condition of a same printing accuracy.

It can be understood that those of ordinary skill in the art can make equivalent replacements or changes according to the technical solutions and the concepts of the present disclosure, and all such changes and replacements should be encompassed within the protection scope of the claims appended to the present disclosure.

What is claimed is:

1. A display panel, comprising a plurality of pixel repeating units distributed in an array, wherein each of the pixel repeating units comprises:
   a first pixel group, a second pixel group, and a third pixel group with different colors;
   wherein the first pixel group and the second pixel group are sequentially arranged along a first direction, and the third pixel group is adjacent to the first pixel group and the second pixel group;
   the first pixel group comprises four first sub-pixels arranged in a matrix, the second pixel group comprises four second sub-pixels arranged in another matrix, and the third pixel group comprises at least two third sub-pixels sequentially arranged along the first direction;
   each of the third sub-pixels is adjacent to one of the first sub-pixels and one of the second sub-pixels, and virtual lines between a center of each of the third sub-pixels, a center of an adjacent first sub-pixels, and a center of an adjacent second sub-pixel define a triangle;
   an area of each of the first sub-pixels is equal to an area of each of the second sub-pixels, and an area of each of the third sub-pixels is twice the area of each of the first sub-pixels; and
   the display panel comprises a first pixel definition layer, wherein the first pixel group, the second pixel group, and the third pixel group are separated from each other by the first pixel definition layer;
   wherein a shape of each of the first sub-pixels is a quarter circle, a shape of each of the second sub-pixels is a quarter circle, and a shape of each of the third sub-pixels is semicircular.

2. The display panel in claim 1, wherein the display panel further comprises a second pixel definition layer, and four of the first sub-pixels of the first pixel group and four of the second sub-pixels of the second pixel group are separated from each other by the second pixel definition layer.

3. The display panel in claim 2, wherein a height of the first pixel definition layer is greater than a height of the second pixel definition layer.

4. The display panel in claim 2, wherein the first pixel definition layer further separates the two third sub-pixels in the third pixel from each other.

5. The display panel in claim 4, wherein the first pixel group is defined as a first pixel printing unit whose sub-pixels are printed together with a single nozzle discharge, the second pixel group is defined as a second pixel printing unit whose sub-pixels are printed together with a single nozzle discharge, and each of the third sub-pixels is defined as a third pixel printing unit whose sub-pixels are printed together with a single nozzle discharge.

6. A display panel, comprising a plurality of pixel repeating units distributed in an array, wherein each of the pixel repeating units comprises:
   a first pixel group, a second pixel group, and a third pixel group with different colors;
   wherein the first pixel group and the second pixel group are sequentially arranged along a first direction, and the third pixel group is adjacent to the first pixel group and the second pixel group;
   the first pixel group comprises four first sub-pixels arranged in a matrix, the second pixel group comprises four second sub-pixels arranged in another matrix, and the third pixel group comprises at least two third sub-pixels sequentially arranged along the first direction; and
   each of the third sub-pixels is adjacent to one of the first sub-pixels and one of the second sub-pixels, and virtual lines between a center of each of the third sub-pixels, a center of an adjacent first sub-pixel, and a center of an adjacent second sub-pixel define a triangle;
   wherein a shape of each of the first sub-pixels is a quarter circle, a shape of each of the second sub-pixels is a quarter circle, and a shape of each of the third sub-pixels is semicircular.

7. The display panel in claim 6, wherein an area of each of the first sub-pixels is equal to an area of each of the second sub-pixels, and an area of each of the third sub-pixels is twice the area of each of the first sub-pixels.

8. The display panel in claim 6, wherein the display panel comprises a first pixel definition layer, and the first pixel group, the second pixel group, and the third pixel are separated from each other group by the first pixel definition layer.

9. The display panel in claim 8, wherein the display panel further comprises a second pixel definition layer, and four of the first sub-pixels of the first pixel group and four of the second sub-pixels of the second pixel group are separated from each other by the second pixel definition layer.

10. The display panel in claim 9, wherein a height of the first pixel definition layer is greater than a height of the second pixel definition layer.

11. The display panel in claim 10, wherein the height of the first pixel definition layer ranges from 1 micron to 2 microns, and the height of the second pixel definition layer ranges from 0.5 microns to 1 micron.

12. The display panel in claim 9, wherein the first pixel definition layer further separates the two third sub-pixels in the third pixel.

13. The display panel in claim 12, wherein the first pixel group is defined as a first pixel printing unit whose sub-pixels are printed together with a single nozzle discharge, the second pixel group is defined as a second pixel printing unit whose sub-pixels are printed together with a single nozzle discharge, and each of the third sub-pixels is defined as a third pixel printing unit whose sub-pixels are printed together with a single nozzle discharge.

14. The display panel in claim 6, wherein a light-emitting pixel unit is composed of one of the first sub-pixels, one of the second sub-pixels, and one of the third sub-pixels.

\* \* \* \* \*